United States Patent
Drost et al.

(10) Patent No.: US 8,102,203 B2
(45) Date of Patent: Jan. 24, 2012

(54) OFFSET CANCELLATION IN A CAPACITIVELY COUPLED AMPLIFIER

(75) Inventors: Robert J. Drost, Los Altos, CA (US); Robert Proebsting, Sonora, CA (US); Arlene Proebsting, legal representative, Sonora, CA (US); Scott M. Fairbanks, Corvallis, OR (US); Ronald Ho, Mountain View, CA (US)

(73) Assignee: Oracle America, Inc., Redwood Shores, CA (US)

( * ) Notice: Subject to any disclaimer, the term of this patent is extended or adjusted under 35 U.S.C. 154(b) by 822 days.

(21) Appl. No.: 11/860,693

(22) Filed: Sep. 25, 2007

(65) Prior Publication Data
US 2009/0079498 A1 Mar. 26, 2009

(51) Int. Cl.
*H03F 1/02* (2006.01)
(52) U.S. Cl. .......................................................... 330/9
(58) Field of Classification Search ................ 330/9, 11; 327/124
See application file for complete search history.

(56) References Cited

U.S. PATENT DOCUMENTS

| 5,109,261 A | 4/1992 | Mead |
| 6,456,159 B1 | 9/2002 | Brewer |
| 6,538,502 B2 * | 3/2003 | Nair et al. .......................... 330/9 |
| 6,958,646 B1 | 10/2005 | Colleran |
| 2005/0285683 A1 | 12/2005 | Drost |

* cited by examiner

*Primary Examiner* — Robert Pascal
*Assistant Examiner* — Khiem D Nguyen
(74) *Attorney, Agent, or Firm* — Park, Vaughan, Fleming & Dowler LLP; Steven E. Stupp

(57) ABSTRACT

A method for calibrating an offset voltage of an amplifier used to amplify capacitively coupled communication signals is described. During this process, a common voltage is applied to one or more inputs to the amplifier. Next, an output of the amplifier is iteratively, measured, and charge is applied to the one or more inputs until the offset voltage is less than a pre-determined value. Note that applying the charge may involve applying a sequence of one or more charge pulses.

20 Claims, 10 Drawing Sheets

OFFSET CANCELLATION IN A CAPACITIVELY COUPLED AMPLIFIER

GOVERNMENT LICENSE RIGHTS

This invention was made with United States Government support under Contract No. NBCH3039002 awarded by the Defense Advanced Research Projects Administration. The United States Government has certain rights in the invention.

BACKGROUND

1. Field of the Invention

The present invention relates to electronic circuits. More specifically, the present invention relates to providing offset cancellation in a circuit that is used to facilitate intra-chip and/or inter-chip proximity communication.

2. Related Art

Advances in semiconductor technology presently make it possible to integrate large-scale systems, which can include tens of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances in inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem has created a bottleneck that continues to grow as semiconductor integration densities continue to increase.

Researchers have begun to investigate alternative techniques for communicating between semiconductor chips. One promising technique involves a form of 'proximity communication' in which arrays of capacitive transmitters and receivers are integrated onto semiconductor chips to facilitate intra-chip and/or inter-chip communication. For example, if a first chip is situated face-to-face with a second chip so that transmitter pads on the first chip are capacitively coupled with receiver pads on the second chip, the first chip can directly transmit signals to the second chip without having to route the signals through intervening signal lines within a printed circuit board.

To operate effectively, proximity communication requires the ability to accurately detect capacitively coupled signals. Unfortunately, these signals are usually very small due to the relatively weak coupling between chips. Note that the separation between the chips is large relative to the area of the pads, and that increasing the pad area would decrease the number of channels available and would increase the power needed to drive the larger pad. For example, with pad widths and chip separations on the order of microns, the capacitance of coupled proximity connectors may be smaller than a femtoFarad (fF).

Furthermore, existing circuits or receivers often make it challenging to properly determine the polarity of signals. For example, latching differential receivers have input offset voltages, which add to or subtract from the potential voltages applied to the inputs of these receivers. Said differently, the input offset voltage of a continuous receiver is the potential voltage that must be applied to an input of this receiver for the differential outputs to be equal. (Note that the ideal input offset voltage is zero.) Unfortunately, such input offset voltages in receivers or sense amplifiers often dominate other noise sources, such as white noise (i.e., random noise having a power spectral density that is independent of frequency over a band of frequencies), shot noise (i.e., noise associated with statistical fluctuations in the number of charge carriers), or 1/f noise (i.e., noise with having a power spectral density that is proportional to the reciprocal of the frequency). For a latching or clocked receiver, these offset voltages add to or (in the worst case, subtract from) the input signals, thereby reducing the bandwidth of the channel by increasing the time needed to amplify the input signals to the level required by digital circuits (or in the worst case, leads to outputs with the incorrect polarity), limiting the overall sensitivity of the amplifiers, and reducing the reliability of the communication channel (for example, the input offset voltage may result in a communication failure). Similarly, for a continuous amplifier an input offset voltage shifts the common mode voltage and can result in distortion or reduced gain.

A variety of existing circuits and techniques are used to determine and cancel offset voltages in sense amplifiers. However, these approaches suffer from a variety of limitations. For example, one technique cancels offset voltages during equilibration before each amplification cycle. Unfortunately, it is often difficult to correct for voltage offsets and current-factor mismatches that occur during regenerative latching in clocked latches using such continuous measurements. In addition, loading introduced by feedback circuits decreases the speed of the amplifier response and increases power consumption. Other techniques have various drawbacks, such as adding parasitic capacitance to critical internal sense amplifier nodes, increasing power consumption, causing larger quantization errors, and/or increasing circuit complexity.

Hence what is needed is a method and an apparatus for determining and correcting for offset voltages in capacitively coupled circuits without the problems listed above.

SUMMARY

One embodiment of the present invention provides a method for calibrating an offset voltage of an amplifier used to amplify capacitively coupled communication signals. During this process, a common voltage is applied to one or more inputs to the amplifier. Next, an output of the amplifier is iteratively, measured and charge is applied to the one or more inputs until the offset voltage is less than a pre-determined value. Note that applying the charge may involve applying a sequence of one or more charge pulses.

In some embodiments, the one or more inputs are floated to remove DC coupling to the one or more inputs after to applying the common voltage. Moreover, after iteratively measuring the output and applying charge to the one or more inputs, the DC coupling to the one or more inputs is restored.

In some embodiments, a given charge pulse in the sequence of charge pulses contains a pre-defined charge. The sequence of charge pulses may include a binary-weighted sequence and/or a partially redundant-weighted sequence. Note that in the binary-weighted sequence an nth charge pulse has a given charge and an n+1th charge pulse has approximately one-half of the given charge. Furthermore, the sequence of charge pulses may include charge pulses having a single polarity, or alternatively, charge pulses having positive polarity and charge pulses having negative polarity. And in some embodiments, the sequence of charge pulses includes a fixed number of charge pulses or a variable number of charge pulses.

In some embodiments, the amplifier is a differential amplifier or a single-ended amplifier.

In some embodiments, the operations in the process are performed during a calibration mode. Moreover, in some embodiments the operations in the process are performed after a time interval following a previous calibration of the offset voltage.

In some embodiments, transistors coupled to the one or more inputs are selectively illuminated with light having wavelengths that are substantially in the ultraviolet range during the calibration of the offset voltage. In some embodiments, signals corresponding to a training sequence are received, and that the offset voltage of the amplifier needs to be calibrated is determined based on the output from the amplifier corresponding to the signals.

In some embodiments, receiving of the capacitively coupled communication signals is resumed after the process is completed.

In some embodiments, charge is applied to a first input of the amplifier if the offset voltage has a first polarity and charge is applied to a second input of the amplifier if the offset voltage has a second polarity. Furthermore, in some embodiments additional charge pulses are applied to the one or more inputs until the offset voltage is over compensated (for example the measured output voltage changes polarity).

In some embodiments, the common voltage is a mid-point between a first voltage that results in a logical "1" at the output of the amplifier and a second voltage that results in a logical "0" at the output of the amplifier.

Another embodiment of the invention provides an electronic circuit used to receive capacitively coupled communication signals. This circuit includes an amplifier that has one or more inputs that are configured to receive the capacitively coupled communication signals. These inputs are selectively DC-coupled to another circuit using a switching mechanism. Furthermore, a voltage-correction mechanism, coupled to the one or more inputs and to an output from the amplifier, is configured to apply a common voltage to the one or more inputs. In addition, the voltage-correction mechanism is configured to iteratively, (1) determine an offset voltage at the one or more inputs to the amplifier based on the output, and (2) to apply charge to the one or more inputs until the offset voltage is less than a pre-determined value. Note that the applied charge may include a sequence of one or more charge pulses.

Another embodiment of the invention provides a computer system that includes a device configured to receive capacitively coupled communication signals.

This device includes the electronic circuit.

BRIEF DESCRIPTION OF THE FIGURES

Note that like reference numerals refer to corresponding parts throughout the drawings.

DETAILED DESCRIPTION

Figure 1A:
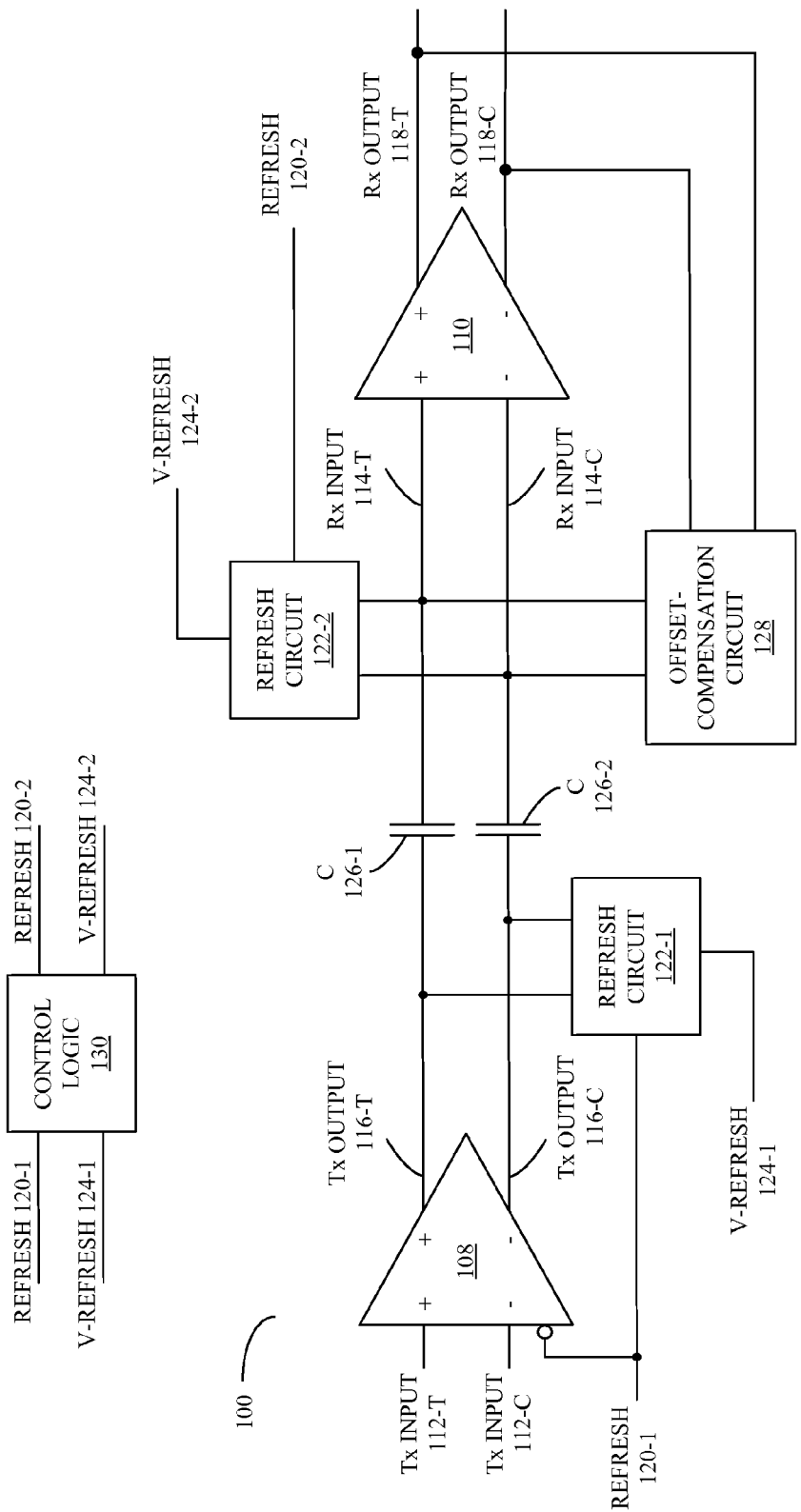
FIG. 1A is a block diagram illustrating a circuit in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a circuit for calibrating an offset voltage of an amplifier, a device that includes the circuit, a system that includes the device, and a method for calibrating the offset voltage of the amplifier are described. Note that the device may be a semiconductor die that includes one or more integrated circuits. This semiconductor die may be configured for intra-chip (on-chip) and/or inter-chip proximity communication (such as with one or more other semiconductor dies) using capacitive-coupled signals, magnetically-coupled signals, and/or optical signals. For example, the semiconductor die may include proximity connectors proximate to a surface of the semiconductor die (i.e., the proximity connectors may be on, beneath, or coupled to the surface) and the amplifier, coupled to the proximity connectors, to receive the capacitively-coupled signals.

In the process, the offset voltage is cancelled (or approximately cancelled) by transferring and storing charge on one or more input nodes of the amplifier. The resulting voltage directly corrects for the input offset voltage and avoids adding capacitance to the internal nodes of the amplifier. Note that the input nodes have limited conductance, which permits them to store the charge and cancel the offset voltage for a long time period. Updating of the stored charge occurs during a calibration mode, which may be infrequent, thereby reducing power consumption. In some embodiments, the calibration is performed once, periodically, after a variable time interval, and/or as needed. For example, a training sequence may be used to determine if the amplifier needs to be calibrated. However, in some embodiments the calibration is performed continuously.

In some embodiments, during the calibration mode a common voltage is applied to the one or more inputs and the one or more inputs are floated to remove DC coupling to the one or more inputs. Note that removing DC coupling includes removing DC signals that are driven onto one or more inputs. Furthermore, in some embodiments the one or more inputs are also floated to remove AC coupling to the one or more inputs.

Then, an output of the amplifier is iteratively, measured, and charge is applied to the one or more inputs until the offset voltage is less than a pre-determined value. Charge may be applied to the one or more input nodes by applying a sequence of one or more charge pulses. This sequence may include unipolar or bipolar charge pulses, and/or may include a fixed or a variable number of charge pulses.

In the discussion that follows, a latching or clocked amplifier is used as an illustrative example. However, in other embodiments the offset-cancellation technique is applied to continuous amplifiers. Note that a latching amplifier amplifies any difference it observes at its input to a full binary value when evaluated, for example, when a clock signal latches its output. Thus, for a latching amplifier the offset voltage may be determined by observing the output when the clock signal is applied, and the compensation is applied until a small enough increment in potential on one of the inputs results in the output being evaluated with a different value. Furthermore, a continuous amplifier amplifies the difference at its output by the gain of the amplifier. In this case, the offset voltage is the voltage added or subtracted from one of the inputs so that the differential outputs are at the same value. Therefore, in the continuous amplifier compensation is applied on one of the inputs until the outputs are within a very small voltage difference from each other, i.e., a difference less than a pre-determined value (such as 1 mV or 0.05 times an average signal amplitude to be received by the continuous amplifier).

We now describe embodiments of the circuit for calibrating the offset voltage of an amplifier. FIG. 1A presents a block diagram illustrating a circuit 100 in accordance with an embodiment of the present invention. Signals are input to transmitter 108 on transmitter (Tx) inputs 112 (include true Tx input 112-T and complement or false Tx input 112-C), which outputs signals on Tx outputs 116. The output signals are capacitively coupled, via capacitors 126, to receiver (Rx) inputs 114 of receiver 110. An amplifier in this receiver produces output signals on Rx outputs 118. Note that the transmitter 108 and the receiver 110 may be on the same semiconductor die (intra-chip proximity communication) and/or on different semiconductor dies (inter-chip proximity communication).

During normal operation, refresh circuits 122 add no conductive loading to the Tx outputs 116 or the Rx inputs 114. However, during a refresh or calibration mode the transmitter 108 and the receiver 110 move through a set of states that permit the DC level of the Rx inputs 114 to be set to a correct common-mode voltage and zero differential voltage (i.e., the Rx inputs 114 may be equilibrated to a common voltage).

Figure 1B:
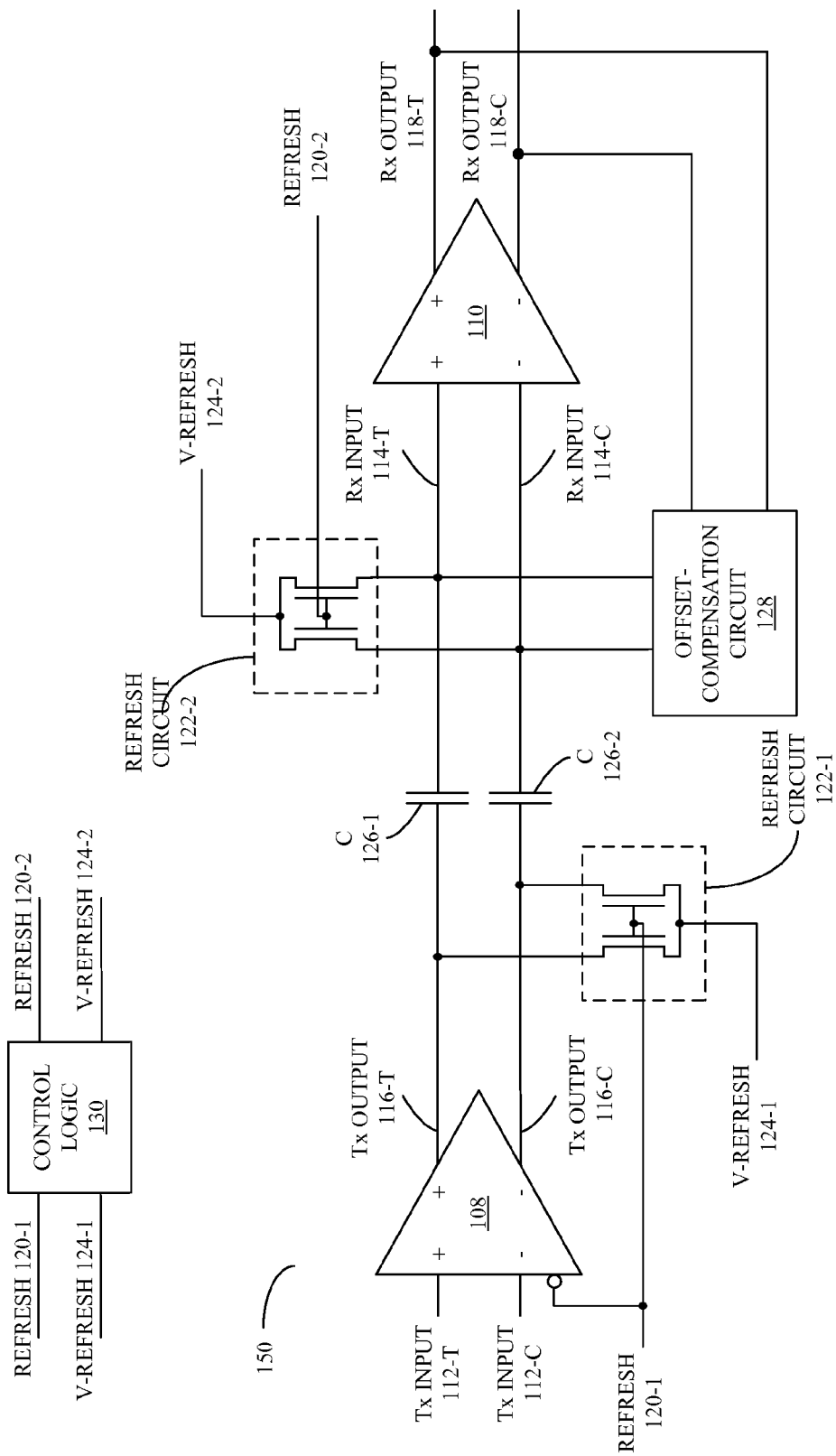
FIG. 1B is a block diagram illustrating a circuit in accordance with an embodiment of the present invention.

In particular, refresh circuit 122-1 may couple a first common voltage (such as refresh voltage 124-1) to Tx outputs 116, and refresh circuits 122-2 may couple a second common voltage (such as refresh voltage 124-2) to Rx inputs 114. In some embodiments, Rx inputs 114 may be floated (using a switching mechanism internal to the receiver 110). Note that the first common voltage and/or the second common voltage may be a mid-point between a first voltage that results in a logical "1" at the Rx outputs 118 of the receiver 110 and a second voltage that results in a logical "0" at the Rx outputs 118 of the receiver 110 (in general, the first common voltage and the second common voltage are not the same, although they can be in some embodiments). Also note that control logic 130 may provide refresh control signals 120 and/or refresh voltages 124 to the refresh circuits 122. For example, as shown in FIG. 1B, which presents a block diagram illustrating a circuit 150, refresh control signals 120 may be coupled to gates of NMOS transistors, thereby selectively coupling refresh voltages 124 to Tx outputs 116 and Rx inputs 114.

Referring back to FIG. 1A, an offset-compensation operation may be performed during the calibration mode using offset-compensation circuit 128 (which may also be controlled by control logic 130). To start this operation, the receiver 110 may be strobed to latch the input signal on the Rx inputs 114. Since these inputs have been set to a common voltage, the receiver 110 samples high or low based solely on whether its offset voltage is positive or negative. Based on this sampling of the offset voltage (using signals on the Rx outputs 118 from the receiver 110), the offset-compensation circuit 128 may adjust or transfer charge on to one or both of the Rx inputs 114.

Figure 3:
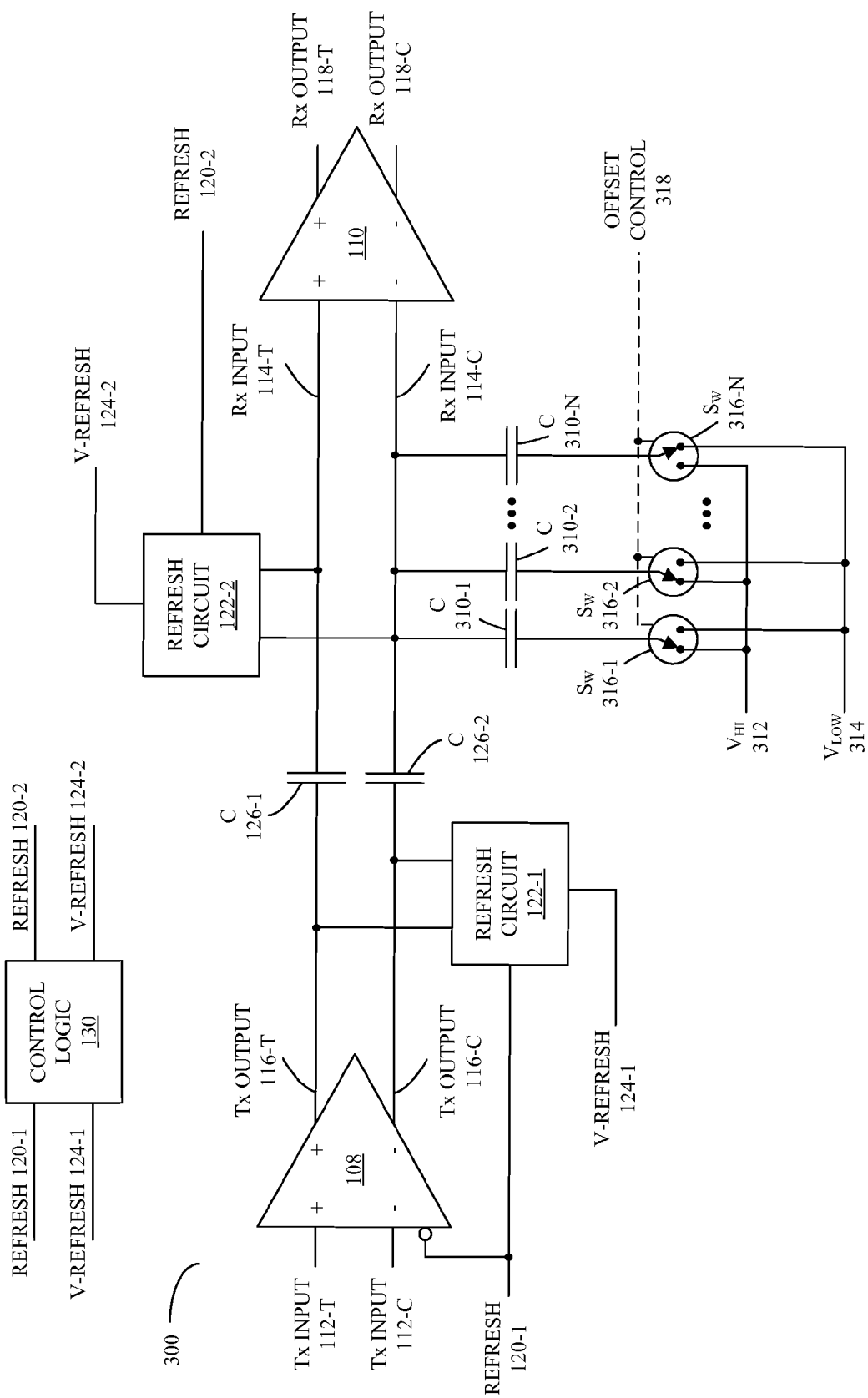
FIG. 3 is a block diagram illustrating a circuit in accordance with an embodiment of the present invention.

For example, as described further below with reference to FIG. 3, control voltages on one or more correcting capacitors may be changed to transfer charge through the correcting capacitors on to the Rx inputs 114. After this first correction step, the offset-compensation circuit 128 may perform an iterative process, which involves determining the remaining offset voltage (by measuring or observing the signals on the Rx outputs 118), and using the offset-compensation circuit 128 to add and/or subtract charge from the Rx inputs 114 as necessary to compensate for the polarity of the most-recently latched offset voltage (based on the polarity of the signals on the Rx outputs 118). Note that the resulting sequence of charge pulses may have a fixed number of charge pulses or a variable number of charge pulses (for example, the charge in a given charge pulse may be varied by changing a current applied to a capacitor or by changing a time interval during which the charge is applied). In the latter case, the process may be repeated until the residual offset voltage is less than a pre-determined value, such as 1 mV on a channel that on average couples 20 mV of signal and expects 5 mV of environmental noise (thus, 1 mV is a small fraction of the usable signal, even in the presence of noise).

Once the calibration is completed, the coupling of the first common voltage to Tx outputs 116 and the second common voltage to the Rx inputs 114 may be discontinued. Then, the transmitter 108 may resume transmitting and the receiver 110 may resume receiving capacitively coupled communication signals.

In some embodiments, during the calibration of the offset voltage transistors coupled to the Rx inputs 114 are selectively illuminated with light having wavelengths that are substantially in the ultraviolet range (which is referred to as ultraviolet-light programming). Other techniques may include hot-electron programming, Fowler-Nordheim programming, and/or a wire that is subsequently cut.

In some embodiments, the transmitter 108 may output signals corresponding to a training sequence. Based on the resulting signals on the Rx outputs 118, the receiver 110 and/or the control logic 130 may assert a logical condition that transitions the circuit 100 into the calibration mode.

While the description above and below uses capacitively coupled signals as an illustration, one embodiment of the present invention uses magnetically coupled signal, where data signals are communicated magnetically (inductive communication) between terminals on close adjacent semiconductor dies. Another embodiment uses optical proximity communication, where data signals are communicated optically between terminals (which may include optical emitters, detectors, and/or gratings) on adjacent semiconductor dies. Yet another embodiment couples connectors in adjacent semiconductor dies, for example, by using an array of solder balls (conductive communication).

Note that while the circuit 100 is illustrated as having a number of components in a given configuration, in other embodiments circuit 100 may include fewer components or additional components. Moreover, two or more components may be combined into a single component, and/or a position of one or more components may be changed. For example, the receiver 110 may include a single-ended amplifier instead of a differential amplifier.

Figure 2A:
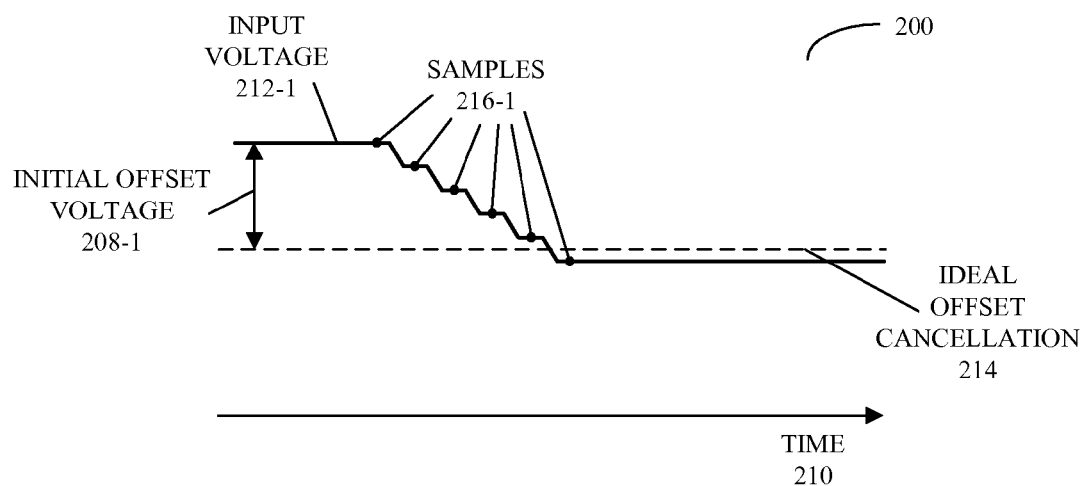
FIG. 2A is a block diagram illustrating input voltage to an amplifier as a function of time in accordance with an embodiment of the present invention.
Figure 2B:
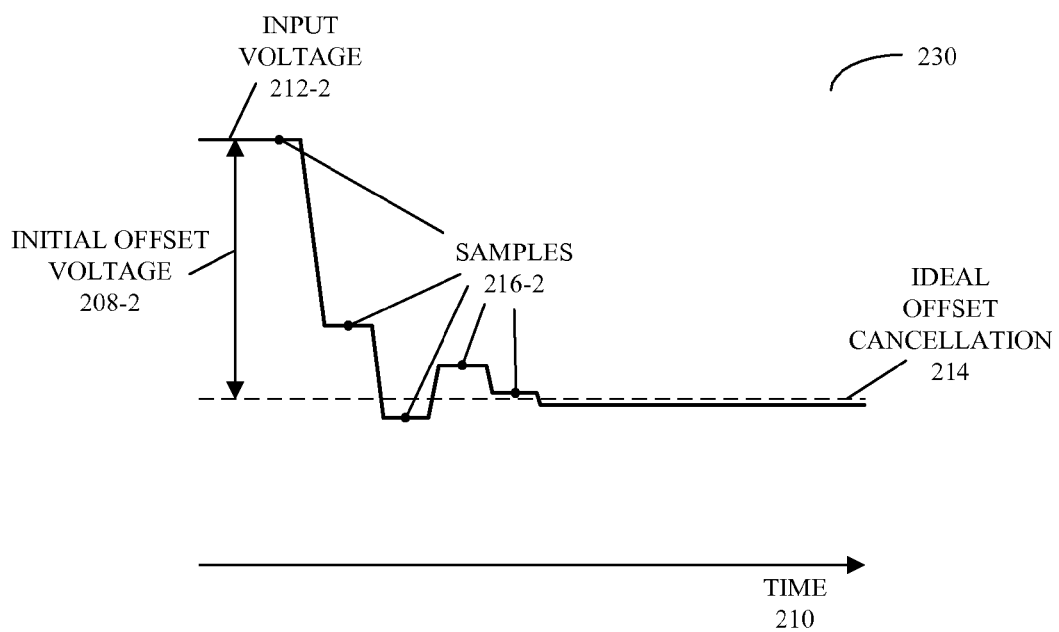
FIG. 2B is a block diagram illustrating input voltage to an amplifier as a function of time in accordance with an embodiment of the present invention.

FIGS. 2A and 2B provide block diagrams illustrating input voltages 212 to an amplifier over time 210 during the calibration mode in accordance with embodiments 200 and 230 of the present invention. As the charge pulses are applied by the offset-compensation circuit 128 (FIGS. 1A and 1B) to the Rx inputs 114 (FIGS. 1A and 1B), the input voltages 212 move towards an ideal offset cancellation 214 (i.e., a final offset voltage that is zero or less than a pre-determined magnitude). Note that samples 216 of the input voltages 212 may be determined at voltages corresponding to mid-points of the charge pulses that are applied to the Rx inputs 114 (FIGS. 1A and 1B). Also note that FIGS. 2A and 2B illustrate residual final offset voltages due to the use of discrete steps in the sequences of charge pulses that are applied to the Rx inputs 114 (FIGS. 1A and 1B). Therefore, in some embodiments continuous signals are used instead of discrete charge pulses.

Embodiment 200 illustrates the effect of charge pulses having a single polarity and a fixed or pre-determined amount of charge. Note that this polarity may be positive or negative, and the pre-determined amount of charge may be associated with the charging (or discharging) of a capacitor (as illustrated by the finite slope in embodiment 200). In contrast, embodiment 230 illustrates the effect on input voltage 212-2 of charge pulses that may have either polarity (i.e., a positive charge pulse and/or a negative charge pulse) and which each may include a variable amount of charge. In general, the polarity need not reverse between adjacent charge pulses. For example, the sign and magnitude of the next charge pulse applied to the Rx inputs 114 (FIGS. 1A and 1B) may be determined based on the sign of the remaining offset voltage as measured or observed at the Rx outputs 118 of the receiver 110 (FIGS. 1A and 1B). In some embodiments, the magnitude is varied by changing a current through a capacitor and/or by changing a time interval during which a charge pulse is applied.

In embodiments where the amplifier in the receiver 110 (FIGS. 1A and 1B) is differential, charge pulses may be applied to one or both of the Rx inputs 114 (FIGS. 1A and 1B). For example, charge may be applied to a first input of the receiver 110 (FIGS. 1A and 1B) if the offset voltage has a first polarity and charge may be applied to a second input of the receiver 110 (FIGS. 1A and 1B) if the offset voltage has a second polarity. Furthermore, in some embodiments additional charge pulses are applied to the one or both of the Rx inputs 114 (FIGS. 1A and 1B) until the offset voltage is over compensated.

In some embodiments, the sequence of charge pulses applied to Rx the inputs 114 (FIGS. 1A and 1B) includes a binary-weighted sequence and/or a partially redundant-weighted sequence. Note that in the binary-weighted sequence an nth charge pulse has a given charge and an n+1th charge pulses has approximately one-half of the given charge (such as the sequence 32-16-8-4-2-1), while in the partially redundant-weighted sequence ranges of charge values in adjacent charge pulses in the sequence of charge pulses partially overlap. The latter may be useful if an implementation of a binary sequence has errors (for example due to offset voltages). Thus, a partially redundant-weighted sequence such as 33-17-9-5-3-2-1 may allow a full-range of bipolar charge pulses to be used to compensate for an offset voltage.

In an exemplary embodiment, an initial offset voltage 208-1 is 28 mV and a series of five −6 mV voltage steps occur in the input voltage 212-1 due to the charge pulses (or voltages associated with the charge pulses) applied to the Rx inputs 114 (FIGS. 1A and 1B). The total offset correction is −30 mV, leaving a residual offset voltage of −2 mV. In this example, the calibration operation ends when the polarity of the input voltage (as determined at the Rx outputs 118 in FIGS. 1A and 1B) changes sign.

In another exemplary embodiment, an initial offset voltage 208-2 is 45 mV and a binary-weighted, sequence of charge pulses (including charge pulses having different polarities) is used. Voltage steps of −32 mV, −16 mV, +8 mV, −4 mV, and −2 mV occur in the input voltage 212-2 due to the charge pulses applied to the Rx inputs 114 (FIGS. 1A and 1B). The total offset correction is −46 mV, leaving a residual offset voltage of −1 mV. Before each correction is applied, the receiver 110 (FIGS. 1A and 1B) may sample the Rx inputs 114 (FIGS. 1A and 1B) to obtain the polarity of the remaining offset voltage.

In some embodiments, the initial offset voltage is inferred from a digital output from the amplifier. 1 mV voltage steps (with a polarity determined by the digital output) may be used to sequentially reduce the offset voltage until the digital output changes (for example, from a logical '1' to a logical '0'). Then, the correction may be stopped, and the remaining offset voltage is known to be bounded with a magnitude that is less than 1 mV.

In some embodiments, the initial offset voltage is directly determined from an analog output from the amplifier. In this case, either the same process as described above for a digital output may be used or the magnitude of the voltage steps may be selected based on the analog output. Note that depending on the mean expected offset voltage, either fixed voltage steps or variable voltage steps may converge faster to a residual offset voltage that is less than a desired threshold (such as 1 mV). Also note that this technique presumes that the amplifier has an initial offset voltage that is bounded, i.e., is less than a maximum magnitude (such as 64 mV for 6-bit binary compensation).

Figure 4:
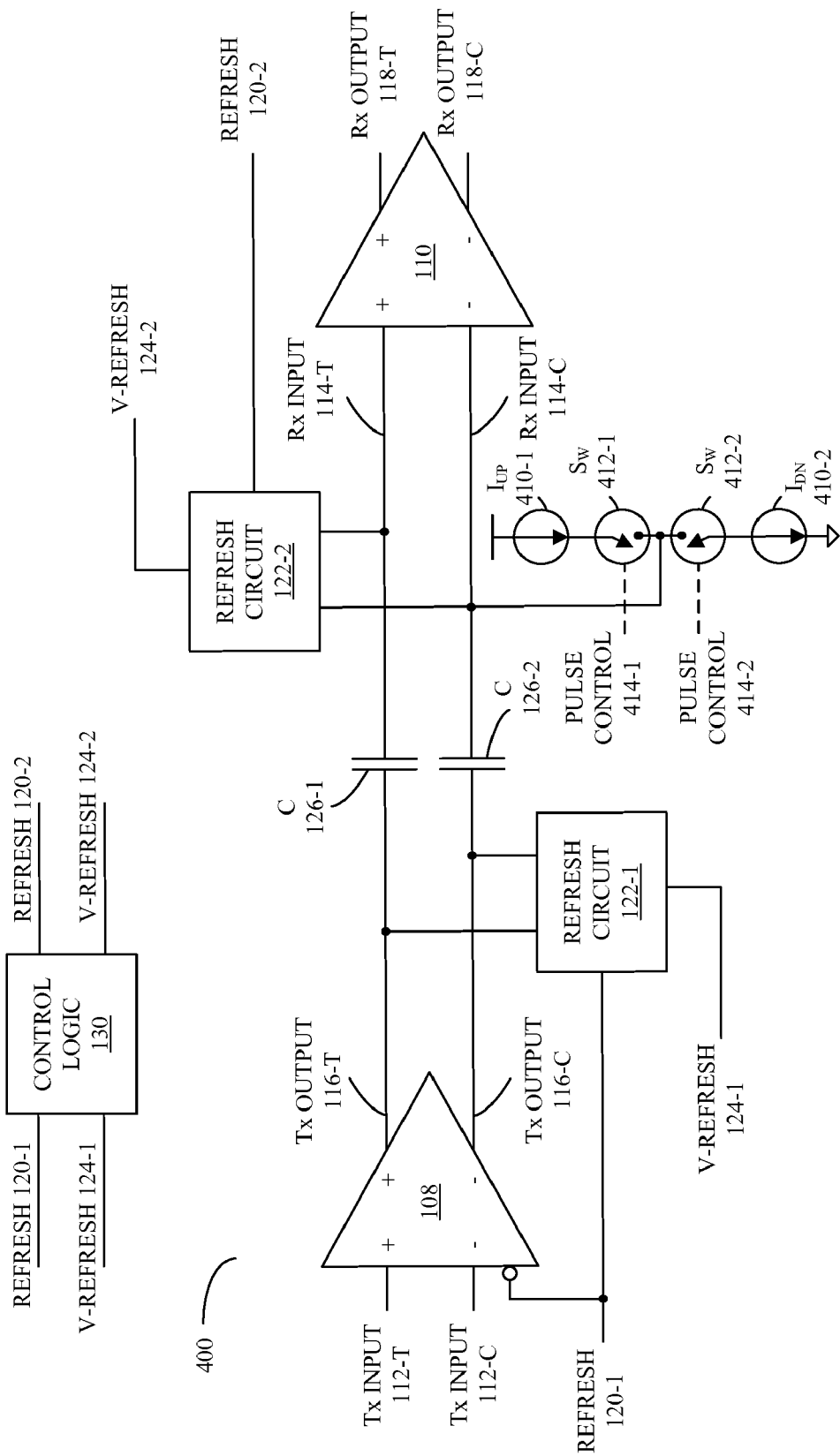
FIG. 4 is a block diagram illustrating a circuit in accordance with an embodiment of the present invention.
Figure 5:
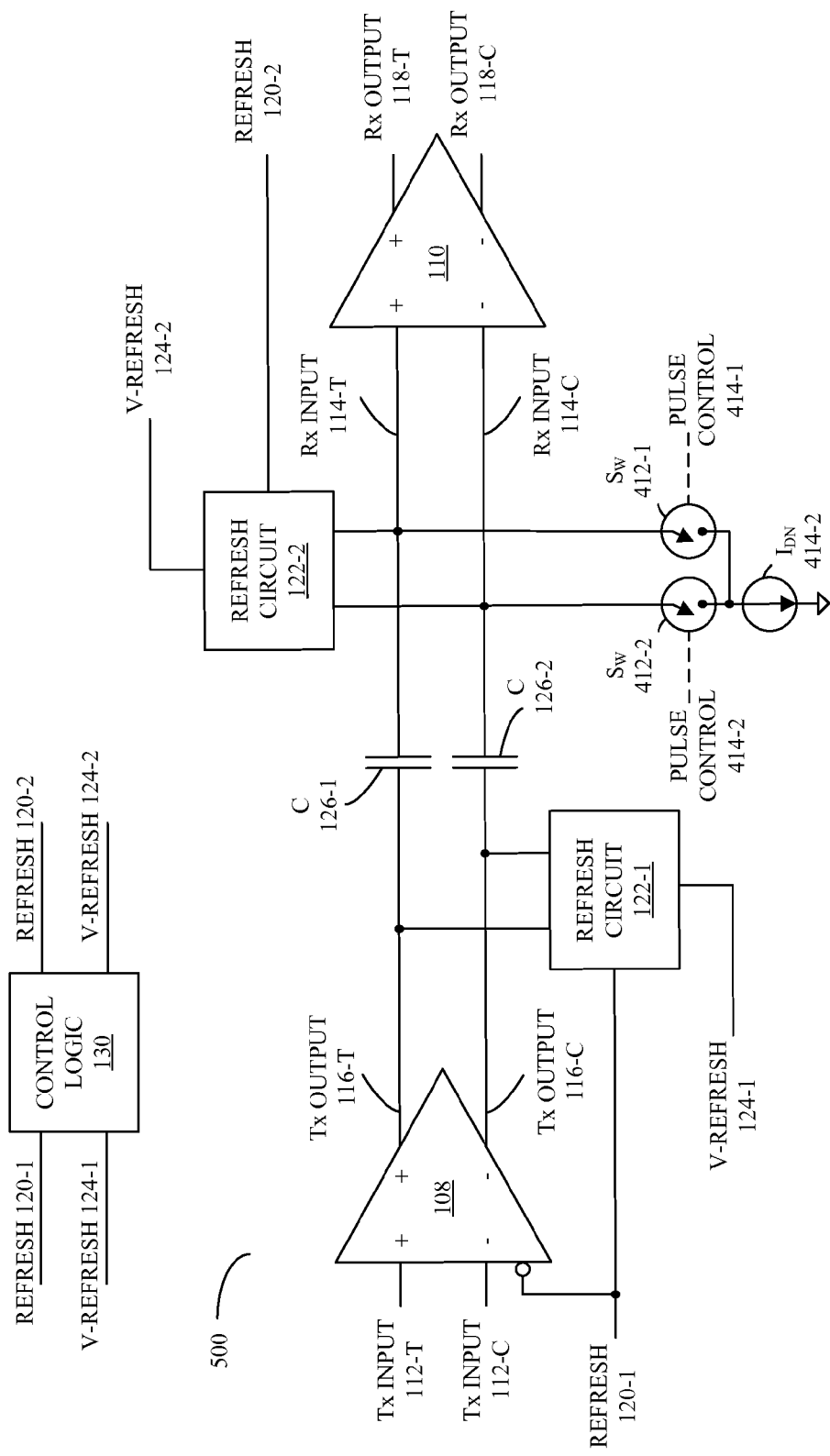
FIG. 5 is a block diagram illustrating a circuit in accordance with an embodiment of the present invention.

Charge may be transferred to the Rx inputs 114 (FIGS. 1A and 1B) using a number of mechanisms, including via a capacitor and/or a charge pump. Several of these alternatives are illustrated in FIGS. 3-5, which provide block diagrams illustrating circuits 300, 400, and 500 in accordance with an embodiment of the present invention.

In the circuit 300, charge is transferred to one of the Rx inputs 114 using a series of capacitors 310. In particular, one terminal of each of the capacitors 310 is coupled to one of the Rx inputs 114, and the other terminal is coupled to a variable voltage source via switches 316. Offset control signals 318 switch the switches 316 between two or more voltages, such as $V_{HI}$ 312 and $V_{LO}$ 314 (which may be positive and/or negative voltages). In the process, charge is transferred to Rx input 114-C and the voltage on the input 114-C changes in steps of $$\frac{\Delta V \cdot C_O}{C_C + C_{Node}},$$

where $\Delta V$ equals $V_{Hi}-V_{LO}$, $C_O$ is the capacitance of one of the capacitors 310, $C_C$ is the capacitance of capacitor 126-2, and $C_{Node}$ if the capacitance of the Rx input 114-C.

Note that $V_{HI}$ 312 and $V_{LO}$ 314 applied to the capacitors 310 may be selected to provide different offset-cancellation ranges. In some embodiments, the voltages on the capacitors 310 are all set to either the supply voltage (Vdd) or to ground. However, in some embodiments different values of $V_{HI}$ and/or $V_{LO}$ may be applied to different subsets of the capacitors 310. Furthermore, in some embodiments the capacitors 310 may be binary weighted, equally weighted, or partially redundant weighted such that multiple codes may be used to produce the same nominal offset-cancellation value. Note that partially redundant weighting may allow for fewer steps than equal weighting, and may also avoid the use of precise ratios (as with binary weighting). And in some embodiments more than two values of voltage may be applied to the capacitors 310. For example, there may be three voltages that can be selected using the switches 316.

In the circuit 400, current sources (charge pumps) 410 add or subtract charge from one of the Rx inputs 114 via switches 412 that are controlled using pulse control signals 414. In particular, current sources $I_{UP}$ 410-1 and $I_{DN}$ 410-2 source or sink charge from the Rx input 114-C.

Circuit 500 illustrates another embodiment in which a single current source $I_{DN}$ 410-2 (in this case a charge sink) is coupled to either of the Rx inputs 114 via switches 412. Note that an amount of charge applied by the current sources 410 in the circuits 400 and 500 may be duty-cycle modulated (using the switches 412) or adjusted by changing the current provided by one or both of the current sources 410 (i.e., analog control).

Note that while the circuits 300, 400, and 500 are illustrated as having a number of components in a given configuration, in other embodiments the circuits 300, 400, and 500 may include fewer components or additional components. Moreover, two or more components may be combined into a single component, and/or a position of one or more components may be changed. For example, the capacitors 310 and/or the current sources 410 may be coupled to Rx input 114-C or to both of the Rx inputs 114. Furthermore, in the circuit 500 a charge source or a combination of a charge sink and a charge source may be used. And in some embodiments, current sources 410 that have different current magnitudes may be used to push and pull charge on the Rx inputs 114.

Figure 6:
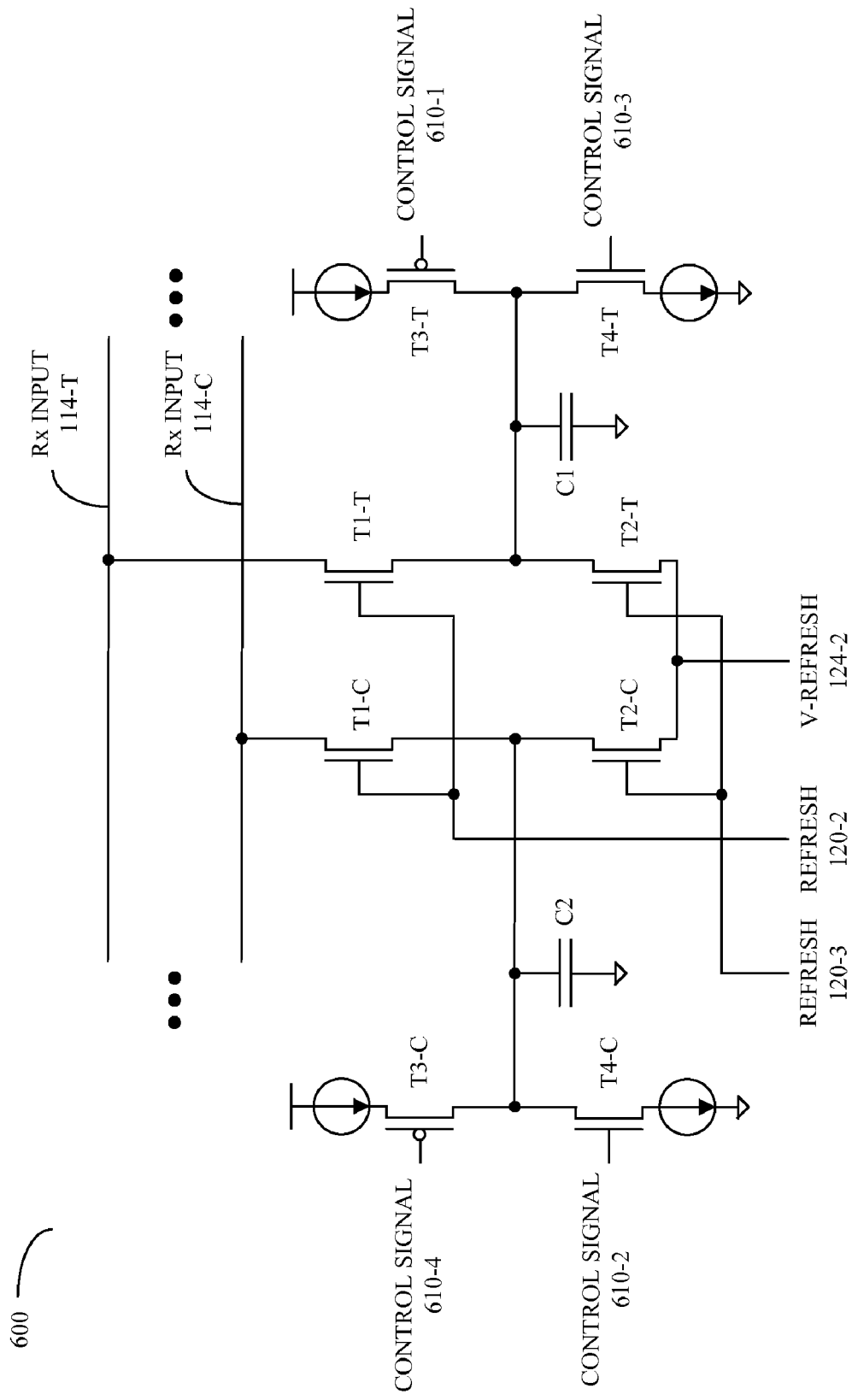
FIG. 6 is a block diagram illustrating a circuit in accordance with an embodiment of the present invention.

FIG. 6 presents a block diagram illustrating a circuit 600 in accordance with an embodiment of the present invention. In this circuit, refresh circuit 122-2 (FIGS. 1A and 1B) and offset-compensation circuit 128 (FIGS. 1A and 1B) are combined. This may increase the coupling from capacitors 126 (FIGS. 1A and 1B) to the receiver 110 (FIGS. 1A and 1B). In particular, the coupling of differential signals from the capacitors 126 (FIGS. 1A and 1B) to the receiver 110 (FIGS. 1A and 1B) during a normal mode of operation of the circuit is determined by the capacitance divider formed by the capacitance of the capacitors 126 (FIGS. 1A and 1B) and stray capacitance, which includes the capacitances at the inputs of the receiver 110 (FIGS. 1A and 1B) and the capacitances at the drains of transistors T1-C and T1-T when these transistors are turned off. Consequently, by combining refresh circuit 122-2 (FIGS. 1A and 1B) and offset-compensation circuit 128 (FIGS. 1A and 1B) and using small transistors for T1-C and T1-T, the coupling of differential signals may be increased during the normal mode of operation of the circuit.

We now describe the operation of the circuit 600 in more detail. During the calibration mode of operation, transistors T1-C, T1-T, T2-C, and T2-T are initially turned on using refresh control signals 120-2 and 120-3. This couples refresh voltage 124-2 to Rx inputs 114 and capacitors C1 and C2.

Next, refresh control signal 120-2 is set low, turning off transistors T1-C and T1-T. Then, the offset voltage is determined by strobing receiver 110 (FIGS. 1A and 1B) and measuring Rx outputs 118. Note that by turning off transistors T1-C and T1-T prior to strobing receiver 110 (FIGS. 1A and 1B), offset voltages associated with the inputs to the receiver and asymmetries in transistors T1-C and T1-T may be determined and compensated for.

If the offset has been successfully compensated, the receiver 110 (FIGS. 1A and 1B) is balanced, and the circuit may return to the normal mode of operation. In particular, control logic 130 (FIGS. 1A and 1B) may set refresh control signal 120-1 (FIGS. 1A and 1B) and refresh control signals 120-2 and 120-3 low.

However, if an offset voltage is measured (or a magnitude of the offset voltage exceeds a minimum threshold, such as 1 mV), transistors T2-C and T2-T may be turned off by setting refresh control signal 120-3 low and transistors T1-C and T1-T are turned on. Then, pairs of transistors may be turned on to apply charge pulses to capacitors C1 and C2, thereby differentially changing the voltages on Rx inputs 114. For example, transistors T3-T and T4-C may be turned on using control signals 610-1 and 610-2, respectively, and the appropriate current sources may supply one or more charge pulses to capacitors C1 and C2. Note that these control signals may be provided by control logic 130 (FIGS. 1A and 1B). Alternatively, for an offset voltage having the opposite polarity, transistors T4-T and T3-C may be turned on using control signals 610-3 and 610-4, respectively, and the appropriate current sources may supply one or more charge pulses of the opposite polarity to capacitors C1 and C2. In an exemplary embodiment, the capacitance of capacitors C1 and C2 is 1 pF.

In this way the Rx inputs 114 may be differentially compensated for the offset voltage. As discussed previously, the offset-voltage measurement and adjustment operations may be repeated until the offset voltage changes sign or until a magnitude of the offset voltage is less than a minimum threshold. Then, the offset-compensation or calibration process may be terminated and the circuit may return to the normal mode of operation by setting refresh control signal 120-1 (FIGS. 1A and 1B) and refresh control signals 120-2 and 120-3 are set low.

Note that while the circuit 600 is illustrated as having a number of components in a given configuration, in other embodiments the circuit 600 may include fewer components or additional components. Moreover, two or more components may be combined into a single component, and/or a position of one or more components may be changed. For example, in other embodiments NMOS transistors may be replaced by PMOS transistors and/or vice versa.

Figure 7:
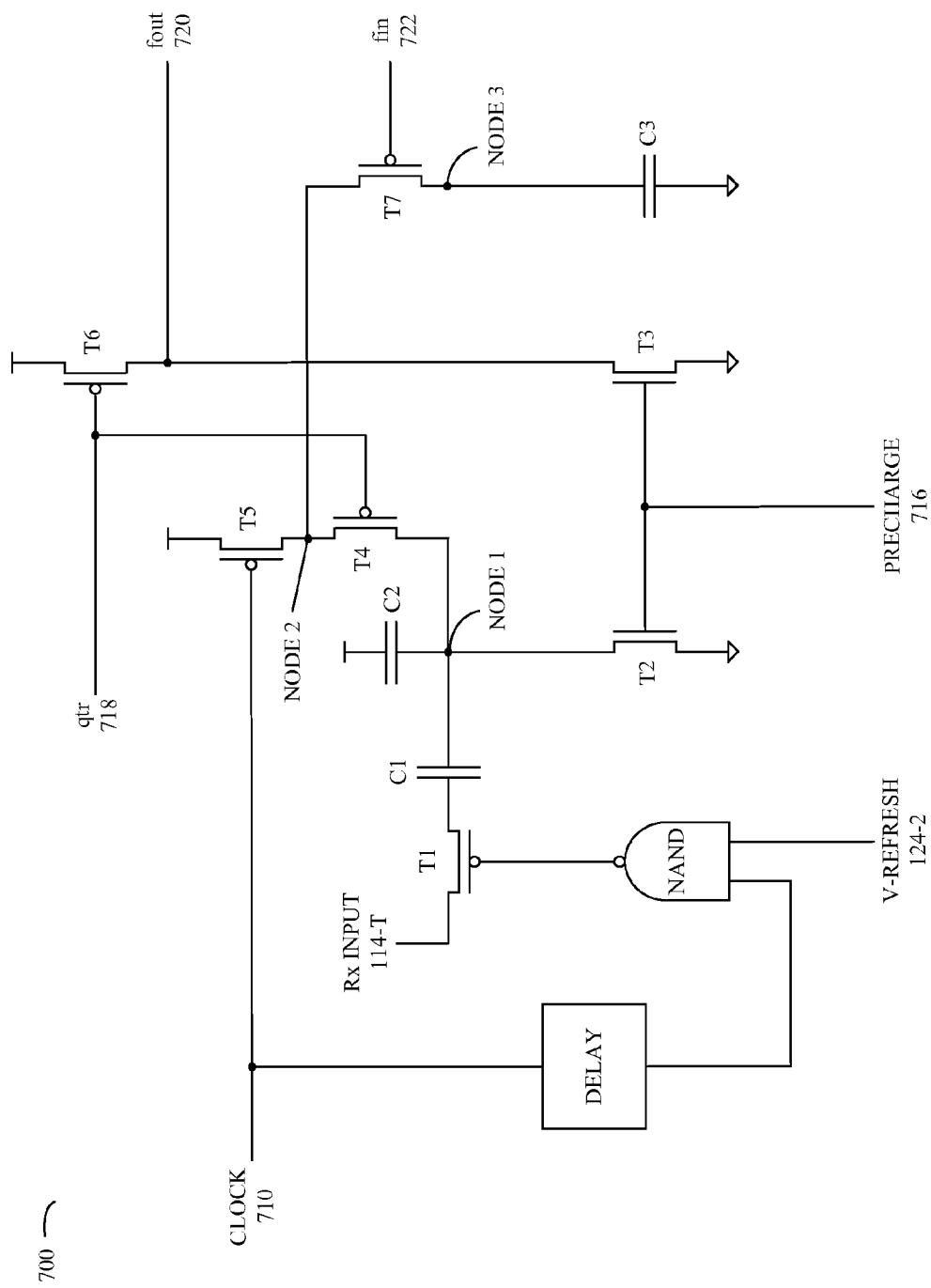
FIG. 7 is a block diagram illustrating a circuit in accordance with an embodiment of the present invention.

In some embodiments, additional components are used to adjust the granularity of the compensation for the offset voltage. This is shown in FIG. 7, which presents a block diagram illustrating an embodiment of a circuit 700. Note that circuit 700 illustrates half of a compensator circuit (i.e., a refresh circuit, such as refresh circuit 122-2 in FIGS. 1A, 1B, and 3-5), which is coupled to one of Rx inputs 114 (FIGS. 1A, 1B, and 3-5), such as Rx input 114-T. Note that a full compensator circuit will include two versions of circuit 700, which are respectively coupled to the Rx inputs 114 (FIGS. 1A, 1B, and 3-5).

During refresh/compensation, the circuit 700 (in conjunction with the refresh circuit) is used to set the differential Rx inputs 114 (FIGS. 1A, 1B, and 3-5) to the same potential. Next, the output of the differential receiver 110 (FIGS. 1A, 1B, and 3-5) is evaluated and, based on the result, charge is added to the input that the receiver 110 (FIGS. 1A, 1B, and 3-5) determined was at a lower potential. These operations may be repeated until the output changes sign and/or is less than a pre-determined value. Then, a finer compensation may be used because it is known that the Rx inputs 114 (FIGS. 1A, 1B, and 3-5) are equal to within the granularity of the larger compensation value.

In the circuit 700, a refresh cycle starts when signal V-refresh 124-2 is set high. Next, precharge 716 asserts and transistors T2 and T3 set node 1 and fout 720 low. Note that fout 720 from circuit 700 attaches to fin on the other half compensator circuit. Because both fout nodes in the two half compensator circuits are driven low, and because fout in one half compensator circuit is the same node as fin in the other half compensator circuit, transistors T7 in both half compensator circuits will conduct. Moreover, note that the nodes fout 720 and fin 722 are state-holding nodes, i.e., they are not always driven to a binary voltage. It is assumed that once these nodes are driven to a certain state, they will hold their values until driven to the opposite state.

Note that initially clock 710 is low. This means that transistor T5 conducts a high potential onto nodes 2 and 3, because transistor T7 is conducting (because of the previously reset node fin 722). Moreover, each time the differential receiver 110 (FIGS. 1A, 1B, and 3-5) evaluates, node qtr 718 pulls low and causes transistor T4 to become transparent. This causes charge sharing to occur between the charge stored at nodes 3 and 2, which are at a high potential, and the charge stored on node 1, which is low after being precharged.

Further, note that transistor T7 changes the amount of compensation applied to Rx input 114-T based on a decision made by the differential receiver 110 (FIGS. 1A, 1B, and 3-5), as reported to the circuit 700 on the node qtr 718. In some embodiment, the 'winning' decision (i.e., the Rx input at the higher potential) determined by the differential receiver 110 (FIGS. 1A, 1B, and 3-5) is reported as a low signal.

Thus, if Rx input 114-T is higher than Rx input 114-C (FIGS. 1A, 1B, and 3-5) when the differential receiver 110 (FIGS. 1A, 1B, and 3-5) evaluates, qtr 718 pulls low. Then, fout 720 is set high, which makes transistor T7 in the other half compensator circuit no longer conduct. Consequently, nodes 2 and 3 in this circuit are now isolated from each other. This means that when the differential receiver 110 (FIGS. 1A, 1B, and 3-5) evaluates, node 1 in the other half compensator circuit shares its charge with only node 2 (not with nodes 2 and 3). Consequently, the total capacitance on node 1 is now smaller and the amount of charge sharing between node 1 and Rx input 114-T decreases. As discussed previously, the compensation may be performed until the offset voltage is less than a pre-defined value and/or until a prescribed number of evaluation/compensation operations are performed.

Note that while the circuit 700 is illustrated as having a number of components in a given configuration, in other embodiments the circuit 700 may include fewer components or additional components. Moreover, two or more components may be combined into a single component, and/or a position of one or more components may be changed. For example, in other embodiments NMOS transistors may be replaced by PMOS transistors and/or vice versa.

Figure 8:
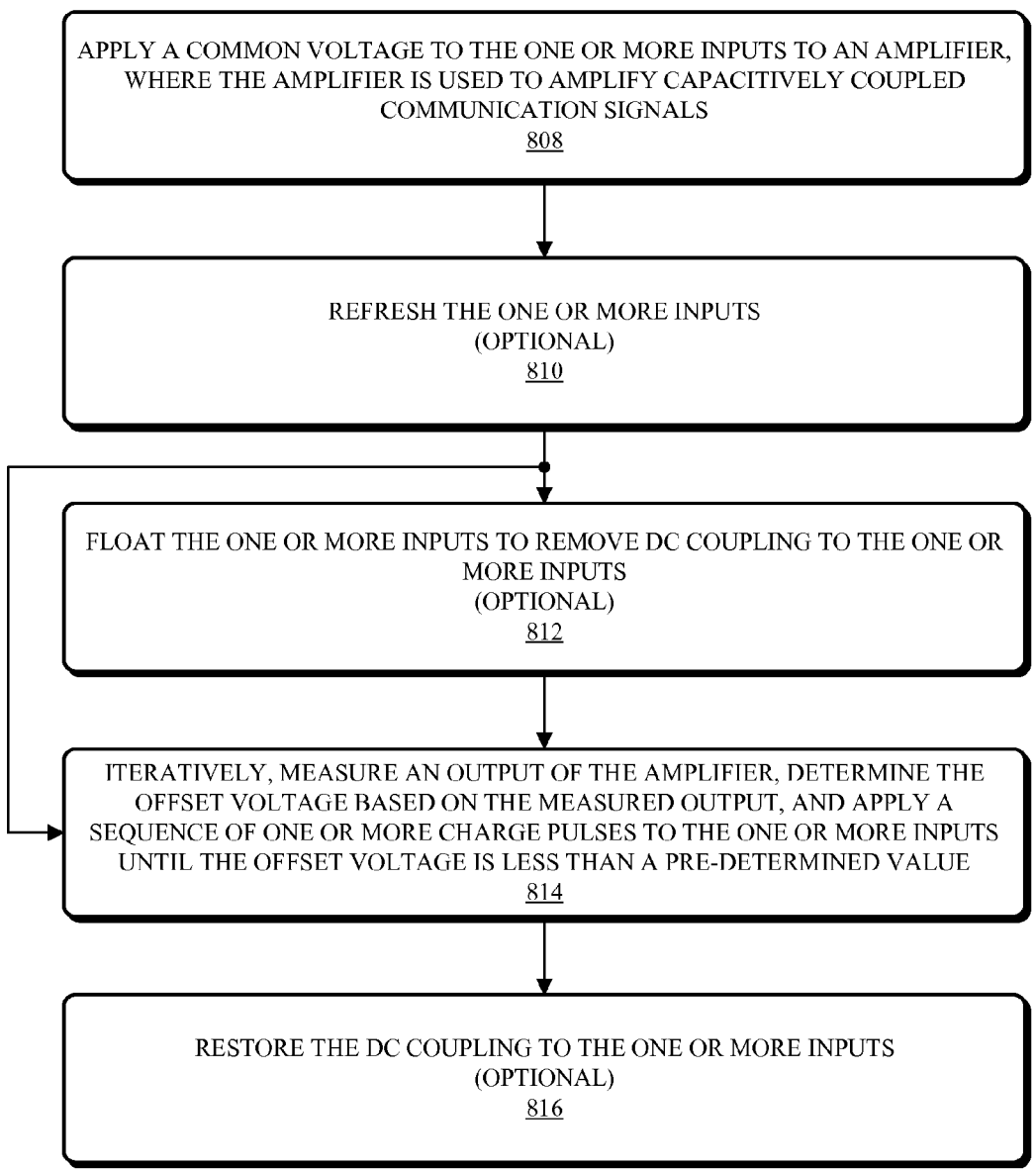
FIG. 8 is a flow chart illustrating a process for calibrating an offset voltage of an amplifier in accordance with an embodiment of the present invention.

We now discuss methods for calibrating the offset voltage of the amplifier. FIG. 8 presents a flow chart illustrating a process 800 for calibrating an offset voltage of an amplifier in accordance with an embodiment of the present invention. During this process, a common voltage is applied to one or more inputs of an amplifier (808). Note that the amplifier is used to amplify capacitively coupled communication signals.

In some embodiments, the one or more inputs are optionally refreshed (810). Next, the one or more inputs are optionally floated to remove DC coupling to the one or more inputs (812).

Furthermore, the system iteratively measures or observes an output of the amplifier, and applies a sequence of one or more charge pulses to the one or more inputs until the offset voltage is less than a pre-determined value (814). Note that in some embodiments a fixed number of charge pulses are applied, while in other embodiments a variable number of charge pulses are used to cancel the offset voltage. Finally, the system optionally restores the DC coupling to the one or more inputs (816). Note that in some embodiments there may be additional or fewer operations, an order of the operations may be changed, and/or two or more operations may be combined into a single operation.

Figure 9:
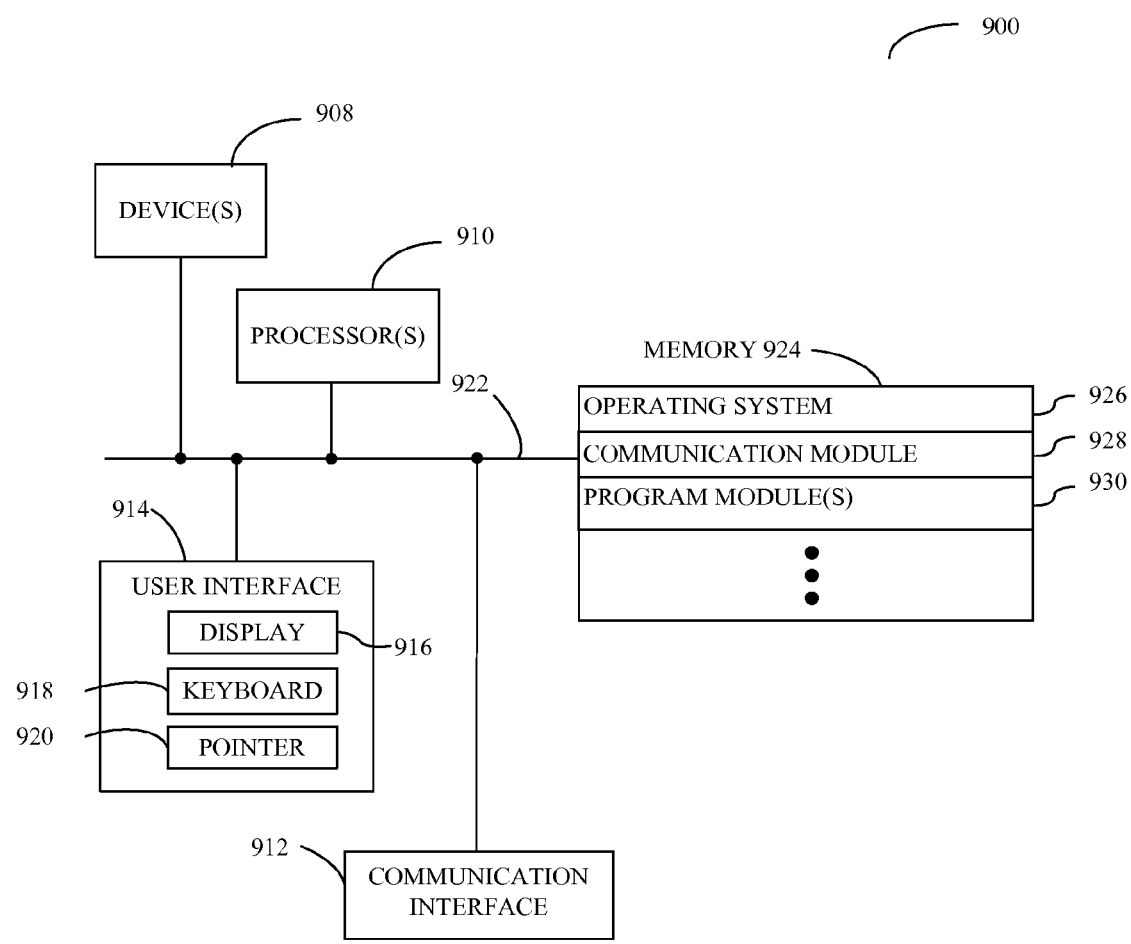
FIG. 9 is a block diagram illustrating a computer system in accordance with an embodiment of the present invention.

The present invention may include systems that contain one or more devices that include components (such as one or more semiconductor dies) that communicate signals using capacitively coupled proximity connectors and include one or more instance of the circuits described previously. For example, FIG. 9 presents a block diagram illustrating a computer system 900 in accordance with an embodiment of the present invention, which includes one or more processors 910, a communication interface 912, a user interface 914, and one or more signal lines 922 coupling these components together. Note that the one or more processing units 910 may support parallel processing and/or multi-threaded operation, the communication interface 912 may have a persistent communication connection, and the one or more signal lines 922 may constitute a communication bus. Moreover, the user interface 914 may include a display 916, a keyboard 918, and/or a pointer, such as a mouse 920.

The computer system 900 may include memory 924, which may include high speed random access memory and/or non-volatile memory. More specifically, memory 924 may include ROM, RAM, EPROM, EEPROM, FLASH, one or more smart cards, one or more magnetic disc storage devices, and/or one or more optical storage devices. Memory 924 may store an operating system 926, such as SOLARIS, LINUX, UNIX, OS X, or WINDOWS, that includes procedures (or a set of instructions) for handling various basic system services for performing hardware dependent tasks. The memory 924 may also store procedures (or a set of instructions) in a communication module 928. The communication procedures may be used for communicating with one or more computers and/or servers, including computers and/or servers that are remotely located with respect to the computer system 900.

Memory 924 may also include one or more program modules (of sets of instructions) 930. Instructions in the program modules 930 in the memory 924 may be implemented in a high-level procedural language, an object-oriented programming language, and/or in an assembly or machine language. The programming language may be compiled or interpreted, i.e, configurable or configured to be executed by the one or more processing units 910.

The computer system 900 may include one or more devices 908 that include semiconductor dies that communicate using proximity communication as described in the previous embodiments.

The computer system 900 may include fewer components or additional components. Moreover, two or more components may be combined into a single component, and/or a position of one or more components may be changed. In some embodiments, the functionality of the computer system 900 may be implemented more in hardware and less in software, or less in hardware and more in software, as is known in the art.

Although the computer system 900 is illustrated as having a number of discrete items, FIG. 9 is intended to be a functional description of the various features that may be present in the computer system 900 rather than as a structural schematic of the embodiments described herein. In practice, and as recognized by those of ordinary skill in the art, the functions of the computer system 900 may be distributed over a large number of servers or computers, with various groups of the servers or computers performing particular subsets of the functions. In some embodiments, some or all of the functionality of the computer system 900 may be implemented in one or more application specific integrated circuits (ASICs) and/or one or more digital signal processors (DSPs).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for calibrating an offset voltage at one or more inputs to an amplifier, comprising:
   applying a common voltage to the one or more inputs to the amplifier, wherein the amplifier is used to amplify capacitively coupled communication signals; and
   iteratively:
      measuring an output of the amplifier;
      determining the offset voltage based on the measured output;
      applying charge to the one or more inputs to the amplifier until the determined offset voltage is less than a predetermined value;
      wherein applying the charge involves applying a sequence of one or more charge pulses.

2. The method of claim 1, further comprising:
   floating the one or more inputs to remove DC coupling to the one or more inputs after applying the common voltage; and
   restoring the DC coupling to the one or more inputs after iteratively measuring the output and applying charge to the one or more inputs.

3. The method of claim 1, wherein a given charge pulse in the sequence of charge pulses contains a pre-defined charge.

4. The method of claim 1, wherein the sequence of charge pulses includes a binary-weighted sequence in which an nth charge pulse has a given charge and an n+1th charge pulses has approximately one-half of the given charge.

5. The method of claim 1, wherein the sequence of charge pulses includes a partially redundant-weighted sequence of charge pulses.

6. The method of claim 1, wherein the amplifier is a differential amplifier or a single-ended amplifier.

7. The method of claim 1, wherein the operations in the method are performed during a calibration mode.

8. The method of claim 1, wherein the operations in the method are performed after a time interval following a previous calibration of the offset voltage.

9. The method of claim 1, further comprising:
   receiving signals corresponding to a training sequence; and
   determining that the offset voltage of the amplifier needs to be calibrated based on the output from the amplifier corresponding to the signals.

10. The method of claim 1, further comprising resuming receiving of the capacitively coupled communication signals.

11. The method of claim 1, wherein charge is applied to a first input of the amplifier if the offset voltage has a first polarity and charge is applied to a second input of the amplifier if the offset voltage has a second polarity.

12. The method of claim 1, wherein the sequence of charge pulses includes charge pulses having positive polarity and charge pulses having negative polarity.

13. The method of claim 1, wherein the sequence of charge pulses includes charge pulses having a single polarity.

14. The method of claim 1, wherein the sequence of charge pulses includes a fixed number of charge pulses.

15. The method of claim 1, wherein the sequence of charge pulses includes a variable number of charge pulses.

16. The method of claim 1, wherein additional charge pulses are applied to the one or more inputs until the offset voltage is over compensated.

17. The method of claim 1, wherein the common voltage is a mid-point between a first voltage that results in a logical "1" at the output of the amplifier and a second voltage that results in a logical "0" at the output of the amplifier.

18. The method of claim 1, wherein the pre-determined value is 0.05 times an average signal amplitude to be received by the amplifier.

19. A computer system, comprising:
   a device configured to receive capacitively coupled communication signals, wherein the device includes an electronic circuit used to receive the capacitively coupled communication signals, and wherein the electronic circuit contains:
      an amplifier including one or more inputs that are selectively coupled to another circuit, wherein the one or more inputs are configured to receive the capacitively coupled communication signals;
      a switching mechanism coupled to the one or more inputs and to the other circuit, wherein the switching mechanism is configured to selectively couple the one or more inputs and the other circuit;
      a voltage-correction mechanism coupled to the one or more inputs and an output from the amplifier, wherein the voltage-correction mechanism is configured to apply a common voltage to the one or more inputs;
      wherein the voltage-correction mechanism is additionally configured to iteratively, determine an offset voltage at the one or more inputs to the amplifier based on the output, and to apply charge to the one or more inputs until the offset voltage is less than a pre-determined value; and
      wherein the applied charge includes a sequence of one or more charge pulses.

20. An electronic circuit used to receive capacitively coupled communication signals, comprising:
   an amplifier including one or more inputs that are selectively coupled to another circuit, wherein the one or more inputs are configured to receive the capacitively coupled communication signals;
   a switching mechanism coupled to the one or more inputs and to the other circuit, wherein the switching mechanism is configured to selectively couple the one or more inputs and the other circuit;
   a voltage-correction mechanism coupled to the one or more inputs and an output from the amplifier, wherein the voltage-correction mechanism is configured to apply a common voltage to the one or more inputs;
   wherein the voltage-correction mechanism is additionally configured to iteratively, determine an offset voltage at the one or more inputs to the amplifier based on the output, and to apply charge to the one or more inputs until the offset voltage is less than a pre-determined value; and wherein the applied charge includes a sequence of one or more charge pulses.

* * * * *